(12) United States Patent
Lee et al.

(10) Patent No.: US 11,329,223 B2
(45) Date of Patent: May 10, 2022

(54) NONVOLATILE MEMORY APPARATUS INCLUDING RESISTIVE-CHANGE MATERIAL LAYER

(71) Applicants: Samsung Electronics Co., Ltd., Suwon-si (KR); SEOUL NATIONAL UNIVERSITY R&DB FOUNDATION, Seoul (KR)

(72) Inventors: Minhyun Lee, Suwon-si (KR); Seongjun Park, Seoul (KR); Hyunjae Song, Hwaseong-si (KR); Hyeonjin Shin, Suwon-si (KR); Kibum Kim, Seoul (KR); Sanghun Lee, Seoul (KR); Yunho Kang, Seoul (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/060,884

(22) Filed: Oct. 1, 2020

(65) Prior Publication Data
US 2021/0020835 A1   Jan. 21, 2021

Related U.S. Application Data

(63) Continuation of application No. 16/144,257, filed on Sep. 27, 2018, now Pat. No. 10,811,604.

(30) Foreign Application Priority Data

Oct. 24, 2017   (KR) .................. 10-2017-0138453

(51) Int. Cl.
*H01L 45/00*   (2006.01)
*H01L 21/768*   (2006.01)
*G11C 13/00*   (2006.01)

(52) U.S. Cl.
CPC ...... *H01L 45/1253* (2013.01); *G11C 13/0004* (2013.01); *H01L 21/76846* (2013.01);
(Continued)

(58) Field of Classification Search
CPC ... H01L 45/144; H01L 45/1233; H01L 45/12; H01L 45/146; H01L 45/08; H01L 45/065;
(Continued)

(56) References Cited

U.S. PATENT DOCUMENTS 5,714,768 A * 2/1998 Ovshinsky .............. H01L 51/05
257/40
8,237,825 B2   8/2012 Wright et al.
(Continued)

FOREIGN PATENT DOCUMENTS

KR   10-2007-0105752   * 10/2007
KR   10-2008-0050989 A   6/2008
(Continued)

OTHER PUBLICATIONS

Ahn, Chiyui et al. "Energy-Efficient Phase-Change Memory with Graphene as a Thermal Barrier." Nano Letters 15 (2015): 6809-6814.*
(Continued)

*Primary Examiner* — Allison Bernstein
(74) *Attorney, Agent, or Firm* — Harness, Dickey & Pierce, P.L.C.

(57) ABSTRACT

A nonvolatile memory apparatus includes a first electrode, a second electrode separated from the first electrode, a resistive-change material layer provided between the first electrode and the second electrode and configured to store information due to a resistance change caused by an electrical signal applied through the first electrode and the second electrode, and a diffusion prevention layer provided between the first electrode and the resistive-change material
(Continued)

layer and/or between the second electrode and the resistive-change material layer and including a two-dimensional (2D) material having a monolayer thickness of about 0.35 nm or less.

19 Claims, 11 Drawing Sheets

(52) U.S. Cl.
CPC ............ *H01L 45/06* (2013.01); *H01L 45/145* (2013.01); *H01L 45/1616* (2013.01); *G11C 13/0007* (2013.01); *G11C 13/0069* (2013.01); *G11C 2013/009* (2013.01); *G11C 2213/51* (2013.01)

(58) Field of Classification Search
CPC ... H01L 45/06; H01L 45/1616; H01L 45/145; H01L 45/1253; H01L 21/76846; G11C 13/0004; G11C 13/0007; G11C 13/0069; G11C 2013/009; G11C 2213/51
See application file for complete search history.

(56) References Cited

U.S. PATENT DOCUMENTS

| | | | |
|---|---|---|---|
| 8,378,859 B2 | 2/2013 | Frederiksen et al. | |
| 8,835,892 B2* | 9/2014 | Jayasekara | B82Y 10/00 257/3 |
| 9,224,945 B2* | 12/2015 | Ramaswamy | H01L 21/02414 |
| 9,232,221 B2 | 1/2016 | Lee et al. | |
| 9,736,384 B2 | 8/2017 | Newman | |
| 2004/0032516 A1 | 2/2004 | Kakarala | |
| 2009/0123066 A1 | 5/2009 | Moriya et al. | |
| 2010/0065803 A1* | 3/2010 | Choi | H01L 45/1233 257/4 |
| 2011/0064370 A1* | 3/2011 | Abraham | H01L 21/265 385/130 |
| 2011/0169126 A1* | 7/2011 | Chen | H01L 45/06 257/528 |
| 2011/0284815 A1* | 11/2011 | Kim | H01L 45/06 257/4 |
| 2015/0003707 A1 | 1/2015 | Amon et al. | |
| 2015/0195462 A1 | 7/2015 | Kano | |
| 2015/0201200 A1 | 7/2015 | Cheong et al. | |
| 2016/0093804 A1* | 3/2016 | Petz | H01L 45/06 257/4 |
| 2016/0119570 A1 | 4/2016 | Wong et al. | |
| 2016/0165236 A1 | 6/2016 | Ikeda | |
| 2017/0025508 A1* | 1/2017 | Lee | H01L 21/76844 |
| 2017/0353680 A1 | 12/2017 | Fukuda | |
| 2018/0122856 A1* | 5/2018 | Banerjee | H01L 45/16 |
| 2018/0204881 A1* | 7/2018 | Sei | H01L 45/04 |

FOREIGN PATENT DOCUMENTS

| | | | |
|---|---|---|---|
| KR | 10-2011-0128644 | * | 11/2011 |
| KR | 10-2017-0137633 A | | 12/2017 |

OTHER PUBLICATIONS

Morrow, Wayne K. et al. "Review of Graphene as a Solid State Diffusion Barrier." Small 12.1 (2016): 120-134.*
Burr, Geoffrey W. et al. "Phase change memory technology." Journal of Vacuum Science & Technology B 28.2 (2010): 223-262.*
Park, Jucheol and JunSoo Bae. "Effect of Ti diffusion on the microstructure of Ge2Sb2Te5 in phase-change memory cell." Microscopy 64.6 (2015): 381-386.*
Lin, Chih-Yang et al. "Modified resistive switching behavior of ZrO2 memory films based on the interface layer formed by using Ti top electrode." Journal of Applied Physics 102 (2007): 094101-1-094101-5.*
Berry, Vikas. "Impermeability of Graphene and its Applications." Carbon (2013): 1-23.*
Baraton, L. et al. "On the mechanisms of precipitation of graphene on nickel thin films." EPL 96 (2011): 46003-p1-46003-p6.*
Hu, B. et al. "Thermodynamic Description of the C—Ge and C—Mg Systems." Journal of Mining and Metallurgy 46.1 B (2010): 97-103.*
Parra, Carolina et al. "Suppressing Bacterial Interaction with Copper Surfaces through Graphene and Hexagonal-Boron Nitride Coatings." ACS Applied Materials & Interfaces 7 (2015): 6430-3437.*
Korean Office Action dated Nov. 18, 2021 issued in corresponding Korean Appln. No. 10-2017-0138453.

* cited by examiner

NONVOLATILE MEMORY APPARATUS INCLUDING RESISTIVE-CHANGE MATERIAL LAYER

CROSS-REFERENCE TO RELATED APPLICATION

This application is a continuation of U.S. application Ser. No. 16/144,257, filed on Sep. 27, 2018, which claims the benefit of Korean Patent Application No. 10-2017-0138453, filed on Oct. 24, 2017, in the Korean Intellectual Property Office, the disclosure of each of which is incorporated herein in its entirety by reference.

BACKGROUND

1. Field

The present disclosure relates to a nonvolatile memory apparatus, and more particularly, to a nonvolatile memory apparatus including a resistive-change material layer.

2. Description of the Related Art

Examples of nonvolatile memory apparatuses may include a phase-change random access memory (PRAM), a flash memory, a resistive-change RAM (RRAM), a ferroelectric RAM (FeRAM), and a magnetic RAM (MRAM).

For example, the PRAM includes a phase-change layer as a data storage layer. When a predetermined (or alternatively, desired) reset voltage is applied to a phase-change layer, a partial region of the phase-change layer may become an amorphous region, and when a predetermined (or alternatively, desired) set voltage is applied to the phase-change layer, the amorphous region may become a crystalline region again. When a resistance of the phase-change layer when the amorphous region exists in the phase-change layer is a first resistance and a resistance of the phase-change layer when all of a phase of the phase-change layer is in a crystalline state is a second resistance, the first resistance is greater than the second resistance. A PRAM is an apparatus from which bit data may be written and read by using resistance characteristics of the phase-change layer, the resistance of which varies according to the phase.

SUMMARY

Provided are nonvolatile memory apparatuses in which a resistive-change material layer using resistance characteristics for reading and writing of bit data is provided as a memory material layer, and resistance characteristics of the resistive-change material layer are maintained.

Additional aspects will be set forth in part in the description which follows and, in part, will be apparent from the description, or may be learned by practice of example embodiments.

According to an aspect of an example embodiment, a nonvolatile memory apparatus includes: a first electrode; a second electrode separated from the first electrode; a resistive-change material layer provided between the first electrode and the second electrode and configured to store information due to a resistance change caused by an electrical signal applied through the first electrode and the second electrode; and a diffusion prevention layer provided between the first electrode and the resistive-change material layer and/or between the second electrode and the resistive-change material layer, the diffusion prevention layer including a two-dimensional (2D) material having a monolayer thickness of about 0.35 nm or less.

The diffusion prevention layer may be a graphene diffusion prevention layer including graphene.

The graphene diffusion prevention layer may have a thickness of about 0.5 nm to about 20 nm.

The graphene diffusion prevention layer may have a grain size of about 1 nm to about 20 nm.

The graphene diffusion prevention layer may have a grain size of about 20 nm or more.

The nonvolatile memory apparatus may further include an atomic layer deposition (ALD) layer on the graphene diffusion prevention layer to reduce and/or prevent diffusion through a grain boundary of the graphene.

The ALD layer may include one selected from among a metal, a nitride, and an oxide.

The ALD layer may include one selected from among Ru, TiN, TaN, TiAlN, AlO, InO, ZnO, AlZnO, InZnO, and RuAlO.

The diffusion prevention layer may be a boron nitride (BN) diffusion prevention layer including BN.

The first electrode may be a plug electrode, and the plug electrode may be narrower than the resistive-change material layer and may be in contact with the diffusion prevention layer.

The resistive-change material layer may include a plug region, and the plug region may be narrower than the first electrode and may be in contact with the diffusion prevention layer.

The resistive-change material layer may be a phase-change layer configured to store information due to a resistance difference through a phase change.

The resistive-change material layer may include one phase-change material selected from among GeTe, GeSb, GeSbTe, AgInSbTe, and N—GeSbTe or other chalcogenide.

The diffusion prevention layer may be disposed between the first electrode and the resistive-change material layer, and the first electrode may include at least one conductive material selected from among TiN, TaN, TiAlN, TaSiN, WN, WNC, and doped-Si.

The second electrode may include at least one conductive material selected from among Al, Au, Cu, Ir, Ru, Pt, Ti, TiN, Ta, and TaN.

The nonvolatile memory apparatus may further include a pad electrode in contact with the first electrode, wherein the pad electrode may include at least one conductive material selected from among Al, Au, Cu, Ir, Ru, Pt, Ti, TiN, Ta, and TaN.

The resistive-change material layer may be configured to store information due to a resistance difference through non-uniform diffusion of oxygen or a resistance difference through a filament formation.

The resistive-change material layer may include one selected from among $HfO_2$, TaOx, TiOx, Ag—Si, Ag—$GeS_2$, and ZrTe—$AL_2O_3$.

The diffusion prevention layer may be disposed between the resistive-change material layer and the second electrode.

The nonvolatile memory apparatus may further include a pad electrode in contact with the first electrode, wherein the diffusion prevention layer may be further provided between the first electrode and the pad electrode.

In the nonvolatile memory apparatus according to some example embodiments, a resistive-change material layer using resistance characteristics for reading and writing of bit data is provided as a memory material layer, and a diffusion prevention layer includes a 2D material having a monolayer thickness of about 0.35 nm.

In the example PRAM or example RRAM to which bit data is written and from which bit data is read by using the resistance characteristics of a memory material layer, resistance characteristics of the memory material layer are more stable and secure the endurance of stored data.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
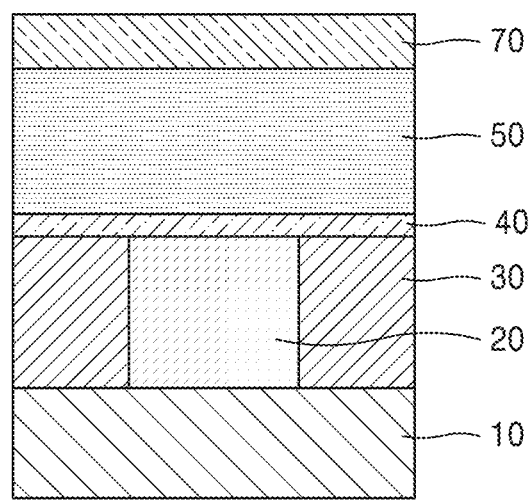
FIG. 1 is a cross-sectional view of a nonvolatile memory apparatus according to example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a nonvolatile memory apparatus including a resistive-change material layer, according to example embodiments, will be described with reference to the accompanying drawings. Sizes or thicknesses of components in the drawings may be exaggerated for clarity convenience of explanation. It will be understood that when a certain layer is referred to as being "on" a substrate or another layer, it may be directly formed on the substrate or the other layer, or an intervening layer may be present.

FIG. 1 is a cross-sectional view of a nonvolatile memory apparatus according to an example embodiment.

Referring to FIG. 1, the nonvolatile memory apparatus may include first and second electrodes 20 and 70 separated from each other, a resistive-change material layer 50 therebetween, and/or at least one diffusion prevention layer 40. Although the layer 40 is referred to herein as a "prevention" layer, the layer 40 may also serve to reduce diffusion, not necessarily prevent diffusion.

The first electrode 20 may be a lower electrode. For example, the first electrode 20 may be a plug electrode. In this case, the first electrode 20 may be provided in, for example, a contact hole of an interlayer insulating layer 30. A pad electrode 10 in contact with the first electrode 20 may be further provided below the interlayer insulating layer 30. The second electrode 70 may be an upper electrode.

The first electrode 20 that is the plug electrode may be narrower than the resistive-change material layer 50 and may be in contact with the diffusion prevention layer 40.

The structures of the first and second electrodes 20 and 70 and the arrangement relationship between the first and second electrodes 20 and 70, the resistive-change material layer 50, and the diffusion prevention layer 40 are only an example and may be variously modified.

The first electrode 20 may serve as a lower electrode and may be a heating electrode or a resistive electrode. The first electrode 20 and the second electrode 70 may include an electrode material used in the memory field including the resistive-change material layer, such as a general phase-change random access memory (PRAM) or resistive-change random access memory (RRAM).

The first electrode 20 may include at least one of various conductive materials such as titanium nitride (TiN), tantalum nitride (TaN), titanium aluminum nitride (TiAlN), tantalum silicon nitride (TaSiN), tungsten nitride (WN), tungsten nitride carbide (WNC), and doped-Si.

The second electrode 70 may include, for example, at least one of various conductive materials such as Al, Au, Cu, Ir, Ru, Pt, Ti, TiN, Ta, and TaN.

Also, the pad electrode 10 contacting the first electrode 20 may include, for example, at least one of various conductive materials such as Al, Au, Cu, Ir, Ru, Pt, Ti, TiN, Ta, and TaN. The pad electrode 10 may include the same conductive material as that of the second electrode 70, or may include a different conductive material from that of the second electrode 70. In FIG. 1 and the following example embodiments, a case where the nonvolatile memory apparatus includes the pad electrode 10 is described as an example, but the pad electrode 10 may be omitted.

The resistive-change material layer 50 stores information due to a resistance change according to an electrical signal applied through the first and second electrodes 20 and 70. The resistive-change material layer 50 may be a phase-change layer 50 that stores information due to a resistance difference through a phase change. Also, the resistive-change material layer 50 may be provided to store information due to a resistance difference through non-uniform diffusion of oxygen. Also, the resistive-change material layer 50 may be provided to store information due to a resistance difference through a filament formation.

FIG. 1 illustrates an example embodiment in which the phase-change layer 50 is provided as the resistive-change material layer 50. For convenience, the same reference numerals are assigned to the resistive-change material layer 50 and the phase-change layer 50.

As illustrated in FIG. 1, when the phase-change layer 50 is provided as the resistive-change material layer 50, the diffusion prevention layer 40 may reduce and/or prevent phase-change characteristics from being deteriorated because the electrode material of the first electrode 20 or the second electrode 70 diffuses as the phase-change material. Also, as in the following example embodiment, when the resistive-change material layer 50 is provided to store information due to the resistance difference through the non-uniform diffusion of oxygen or the filament formation, the diffusion prevention layer 40 may reduce and/or prevent a resistance of a memory cell from being increased due to a diffusion of oxygen into the first electrode 20 or the second electrode 70, and/or may reduce and/or prevent deterioration of reliability.

The phase-change layer 50 may include, for example, GexSbyTez (x, y, z≥0) as a phase-change material. The phase-change layer 50 may include, for example, GeTe, GeSb, GeSbTe, AgInSbTe, and N—GeSbTe. In addition, the phase-change layer 50 may include various phase-change materials that store information due to a resistance difference through a phase change.

For example, the phase-change layer 50 may include a two-dimensional (2D) material having a layered structure. The 2D material is a single-layer solid or a half-layer solid in which atoms form a predetermined (or alternatively, desired) crystal structure. The 2D material that constitutes the phase-change layer 50 may include a chalcogenide-based material having a 2D crystal structure. The chalcogenide-based material may be a metal chalcogenide-based material or a non-metal chalcogenide-based material. The metal chalcogenide-based material may include at least one transition metal selected from among Mo, Nb, and Co and at least one chalcogen atom selected from among S, Se, and Te. The chalcogenide material including the transition metal may be, for example, MoTex, CoTex, and NbSx. Also, the metal chalcogenide-based material may be a chalcogenide-based material including a non-transition metal. The non-transition metal may be, for example, In, Tl, and Sn. That is, a compound of the non-transition metal such as In, Tl, and Sn and the chalcogen atom such as S, Se, and Te may be used as the metal chalcogenide-based material. The chalcogenide material including the non-transition metal may be, for example, SnSx, InxSey, In—S, and Tl—Se. Also, the chalcogenide-based material may be a non-metal chalcogenide-based material. A non-metal atom of the non-metal chalcogenide-based material may include, for example, Ge. In example embodiments, the non-metal chalcogenide-based material may be, for example, Ge—Te, Ge—S, and Ge—Se. Therefore, the chalcogenide-based material may include at least one selected from among MoTex, CoTex, NbSx, SnSx, InxSey, In—S, Tl—Se, Ge—Te, Ge—S, and Ge—Se. The chalcogenide-based material may be a binary material. The phase-change layer 50 may include a 2D material of a single-layer, or may have a structure in which a single-layer having a 2D crystal structure is repeatedly laminated. That is, the 2D material of the phase-change layer 50 may have a layered structure. In example embodiments, the layered structure may be a single-layered structure or a multi-layered structure. A phase of the phase-change layer 50 may be changed by an electrical signal applied to the phase-change layer 50 through the first electrode 20 and the second electrode 70. The phase-change layer 50 may have a first crystalline phase. A phase of at least a portion of the phase-change layer 50 may be changed from the first crystalline phase to a second crystalline phase by the application of the electrical signal.

Figure 2:
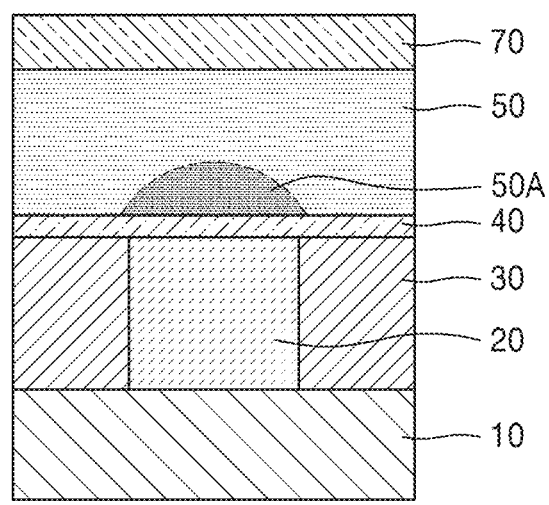
FIG. 2 is a cross-sectional view illustrating a case where a phase of a portion of a phase-change layer of FIG. 1 is changed.

FIG. 2 is a cross-sectional view illustrating a case where a phase of a portion of the phase-change layer 50 of FIG. 1 is changed.

Referring to FIG. 2, when an electrical signal (electrical energy) is applied to the phase-change layer 50 through the first electrode 20 and the second electrode 70, a phase of a 2D material in at least a portion of the phase-change layer 50 may be changed from a first crystalline phase to a second crystalline phase. Reference numeral 50A represents a phase-changed region. The phase-changed region 50A may be a second crystalline phase, and a phase of the other region except for the phase-changed region 50A in the phase-change layer 50 may be a first crystalline phase. An operation of forming the phase-changed region 50A on the phase-change layer 50 may be referred to as a set operation. The set operation may lower a resistance (electrical resistance) of the phase-change layer 50.

When an electrical signal different from the electrical signal applied during the set operation is applied to the phase-change layer 50 in a state in which the phase-changed region 50A is formed, the phase of the phase-changed region 50A may be changed again. That is, the phase of the phase-changed region 50A may be changed from the second crystalline phase to the first crystalline phase. Consequently, the phase-change layer 50 may have the first crystalline phase as a whole. In other words, the phase-change layer 50 of FIG. 2 may be changed again as in the phase-change layer 50 of FIG. 1. The operation of changing the phase-changed region 50A again to the first crystalline phase, that is, the operation of changing the phase-change layer 50 of FIG. 2 again as in the phase-change layer 50 of FIG. 1, may be referred to as a reset operation. The reset operation may increase a resistance (electrical resistance) of the phase-change layer 50. The shape or range (size) of the phase-changed region 50A illustrated in FIG. 2 is only an example and may be variously modified.

The diffusion prevention layer 40 may be provided between the first electrode 20 and the resistive-change material layer 50 and/or between the second electrode 70 and the resistive-change material layer 50 and may include a 2D material having a monolayer thickness of about 0.35 nm or less. In FIGS. 1 and 2, a case where the diffusion prevention layer 40 is provided between the first electrode 20 and the resistive-change material layer 50 is illustrated as an example.

The diffusion prevention layer 40 may be, for example, a graphene diffusion prevention layer including graphene. Also, the diffusion prevention layer 40 may be, for example, a boron nitride (BN) diffusion prevention layer including BN.

When the diffusion prevention layer 40 includes graphene, the graphene diffusion prevention layer may have a thickness of about 0.3 nm to about 20 nm. Since the graphene monolayer has a thickness of about 0.3 nm, the graphene diffusion prevention layer 40 may include monolayer graphene or multi-layer graphene.

The graphene diffusion prevention layer may be formed by a transfer process after deposition on another substrate, may be formed by direct deposition, or may be formed by coating of a graphene-containing solution and subsequent thermal treatment. Also, the graphene diffusion prevention layer may be formed by reduced graphene oxide (rGO).

The graphene diffusion prevention layer may include nanocrystalline graphene having a crystal grain size of about 1 nm to about 20 nm. At this time, the nanocrystalline graphene may be, for example, directly grown through direct deposition. Also, graphene constituting the graphene diffusion prevention layer may have a crystal grain size of about 20 nm or greater. At this time, the graphene diffusion prevention layer having a crystal grain size of about 20 nm or greater may be formed by a transfer method.

Figure 3:
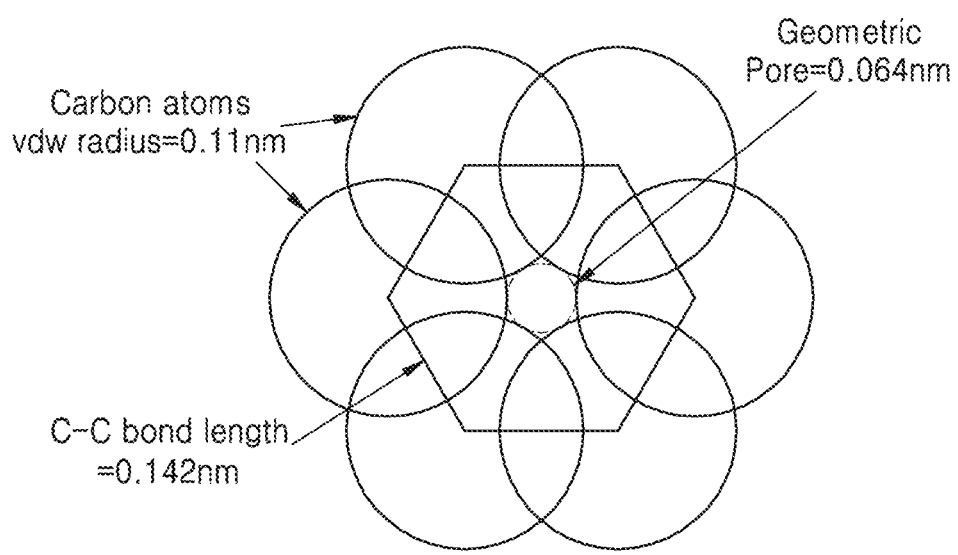
FIG. 3 is a view illustrating impermeability of graphene.

FIG. 3 is a view illustrating impermeability of graphene.

Referring to FIG. 3, graphene has a structure in which carbon atoms form a 2D plane. The carbon atoms form a hexagonal lattice and are positioned at vertices of the hexagon. In such graphene, a size of a geometric pore surrounded by the carton atoms forming the hexagonal lattice is as small as about 0.064 nm, and thus, the diffusion of most materials may be reduced and/or prevented.

In the case of graphene, since the size of the geometric pore is as small as about 0.064 nm, the diffusion prevention layer 40 including graphene may reduce and/or prevent the diffusion of an electrode material applied to the first electrode 20 or the second electrode 70.

The impermeability of graphene as illustrated in FIG. 3 may be applied to a case of BN.

That is, BN has a structure that forms a 2D plane and is arranged to form a hexagonal lattice, and a size of a geometric pore is as small as about 0.064 nm, which is similar to graphene. Thus, the diffusion prevention layer including BN may reduce and/or prevent the diffusion of an electrode material applied to the first electrode 20 or the second electrode 70.

When the size of the geometric pore is about 0.064 nm or less, only H+, C4+, and N3+ penetrate through the pore, and the other materials do not penetrate through the pore, thereby reducing and/or preventing diffusion. Also, when the size of the geometric pore is in a range of about 0.064 nm to 0.142 nm, only Be2+, B3+, Al3+, Si4+, and P3+ penetrate through the pore, and the other materials do not penetrate through the pore, thereby reducing and/or preventing diffusion. When the size of the geometric pore is about 0.142 nm or more, Li1+ and Mg2+ may penetrate through the pore.

Also, since the diameters of ionic states of Ag, Ge, In, Sb, and Te are about 0.162 nm, about 0.106 nm, about 0.152 nm, about 0.148 nm, and about 0.114 nm, the 2D material such as graphene or BN having a small size of a geometric pore may reduce and/or prevent diffusion of such materials.

Therefore, when the diffusion prevention layer 40 includes graphene, graphene may serve as a diffusion barrier. Also, when the diffusion prevention layer 40 includes BN, BN may serve as a diffusion barrier.

Figure 4:
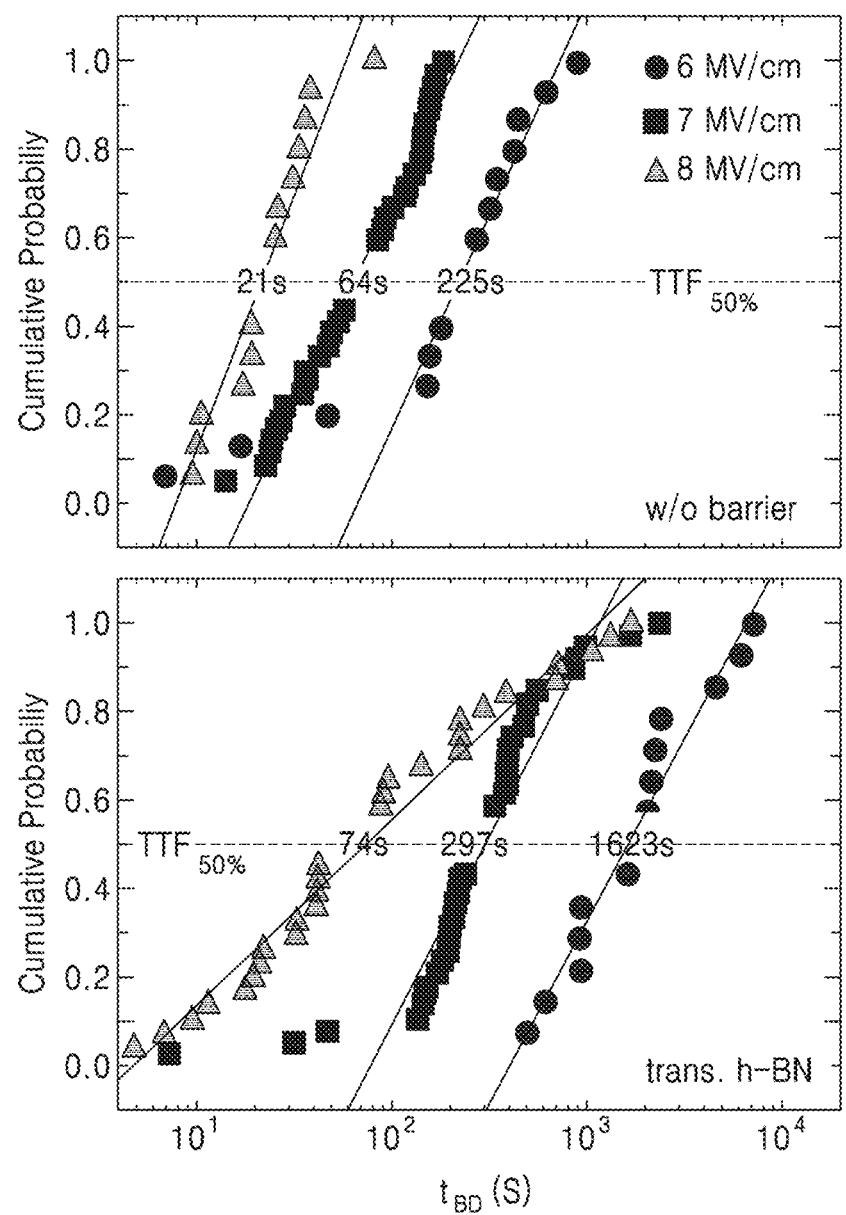
FIG. 4 illustrates a role of boron nitride (BN) as a copper (Cu) diffusion barrier and illustrates a difference in a time to failure (TTF) until a failure occurs when a BN barrier is absent (w/o barrier: an upper graph) and a BN layer is present (trans h-BN: a lower graph)

FIG. 4 illustrates a role of BN as a Cu diffusion barrier and illustrates a difference in a time to failure (TTF) until a failure occurs when a BN barrier is absent (w/o barrier: an upper graph) and a BN layer is present (trans h-BN: a lower graph). In FIG. 4, a horizontal axis represents time, and a vertical axis represents cumulative probability.

As can be seen from a comparison between the upper graph and the lower graph in FIG. 4, when BN is applied as the Cu diffusion barrier, the time until the failure occurs is significantly long, and thus, BN may serve as the Cu diffusion barrier.

Meanwhile, graphene constituting the diffusion prevention layer 40 may have a grain. As described above, graphene constituting the diffusion prevention layer 40 may have a grain size of about 1 nm to about 20 nm, or may have a grain size of about 20 nm or more.

Figure 5:
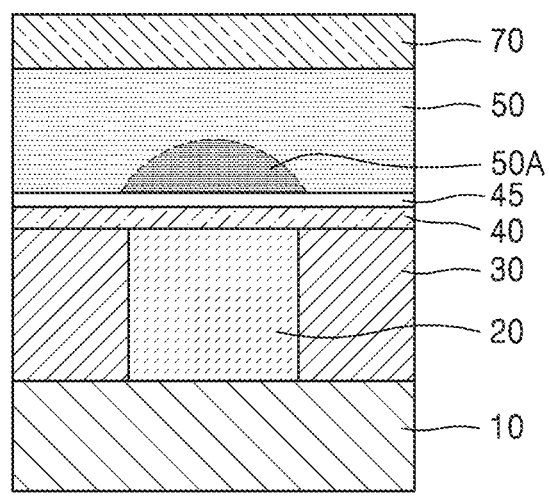
FIG. 5 is a cross-sectional view of a nonvolatile memory apparatus according to another example embodiment.

When graphene has a grain and thus the graphene diffusion prevention layer is provided as the diffusion prevention layer 40 so as to block a probability that diffusion will occur through a grain boundary, an atomic layer deposition (ALD) layer 45 may be further formed on the diffusion prevention layer as illustrated in FIG. 5.

FIG. 5 is a cross-sectional view of a nonvolatile memory apparatus according to another example embodiment.

As illustrated in FIG. 5, when the diffusion prevention layer 40 is disposed between the first electrode 20 and the resistive-change material layer 50, the ALD layer 45 may be disposed between the diffusion prevention layer 40 and the resistive-change material layer 50.

The ALD layer 45 may include one selected from among a metal, a nitride, and an oxide. For example, the ALD layer 45 may include a metal such as Ru, a nitride such as TiN, TaN, and TiAlN, and an oxide such as AlO, InO, ZnO, AlZnO, InZnO, and RuAlO.

In FIG. 5, a case where a phase of a portion of a phase-change layer 50 is changed to form a phase-changed region 50A is illustrated as an example. As described above, the phase-changed region 50A may differently appear according to an electrical signal (electrical energy) applied to the phase-change layer 50 through the first electrode 20 and the second electrode 70.

Figure 6:
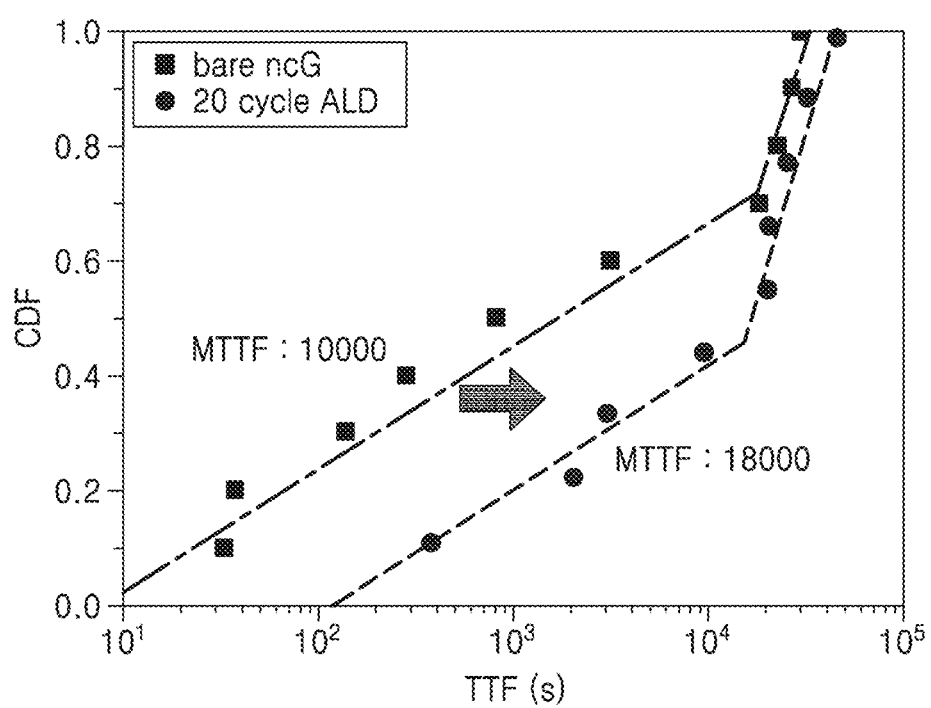
FIG. 6 is a graph showing barrier effect increase characteristics when an atomic layer deposition (ALD) layer is formed on a graphene diffusion prevention layer.

FIG. 6 is a graph showing barrier effect increase characteristics when an ALD layer 45 is formed on a graphene diffusion prevention layer. In FIG. 6, a horizontal axis represents time to failure (TTF) until a failure occurs, and a vertical axis represents a cumulative density function (CDF). In FIG. 6, MTTF means a mean time to failures until a failure occurs from a start.

As can be seen from FIG. 6, when ALD layers are formed on graphene 20 times (20 cycle ALD), a duration time before a failure occurs is significantly improved, as compared with pure graphene (bare ncG). This is because the diffusion through the grain boundary of graphene is blocked by the ALD layer 45.

Figure 7:
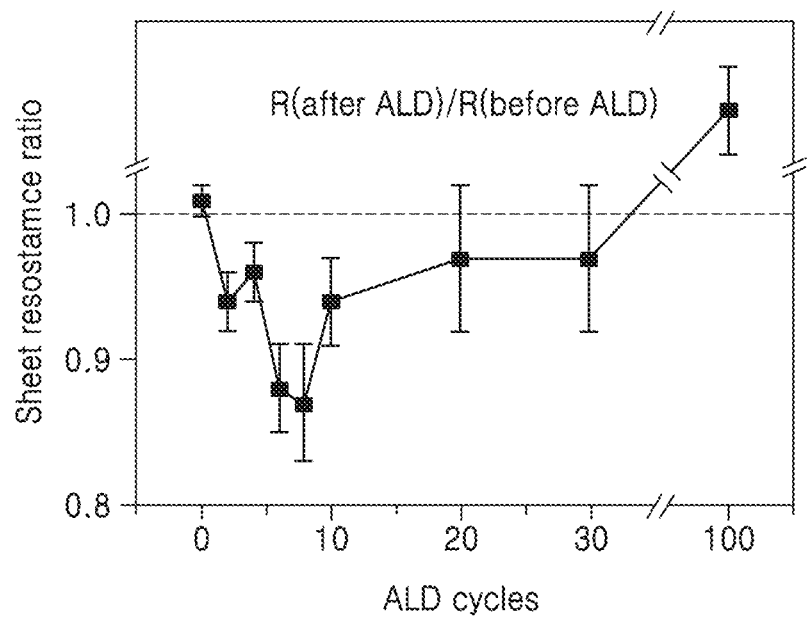
FIG. 7 illustrates a ratio of a sheet resistance before an $Al_2O_3$ ALD layer is formed on graphene (before ALD) to a sheet resistance after the $Al_2O_3$ ALD layer is formed (after ALD), according to ALD cycles.

FIG. 7 illustrates a ratio of a sheet resistance before an Al2O3 ALD layer is formed on graphene (before ALD) and a sheet resistance after the Al2O3 ALD layer is formed (after ALD) according to ALD cycles.

Referring to FIG. 7, until the ALD cycles reach, for example, about 30 cycles, a sheet resistance before the ALD layer 45 is formed on graphene (before ALD) is similar to a sheet resistance after the ALD layer 45 is formed on graphene (after ALD). It can be seen that the ALD layer 45 formed on graphene blocks diffusion through the grain boundary of graphene, without significantly affecting resistance characteristics of the device.

That is, as can be seen from FIGS. 6 and 7, the ALD layer formed on the graphene diffusion prevention layer increases the barrier effect of the graphene diffusion prevention layer and does not significantly affect resistance characteristics of the graphene diffusion prevention layer.

In the nonvolatile memory apparatus according to an example embodiment, a case where the diffusion prevention layer 40 is disposed between the first electrode 20, that is, the lower electrode and the resistive-change material layer 50 has been described, but the position of the diffusion prevention layer 40 may be variously modified. Also, a case where the first electrode 20 is a plug electrode has been described but the first electrode 20 may be a pad electrode.

Figure 8:
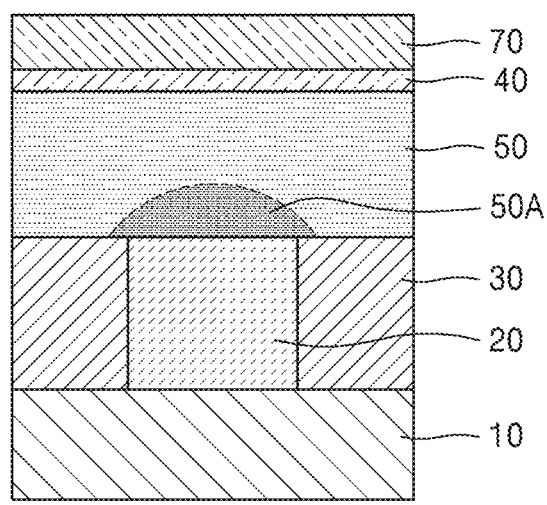
FIGS. 8 to 14 are cross-sectional views of a nonvolatile memory apparatus according to other example embodiments.
Figure 9:
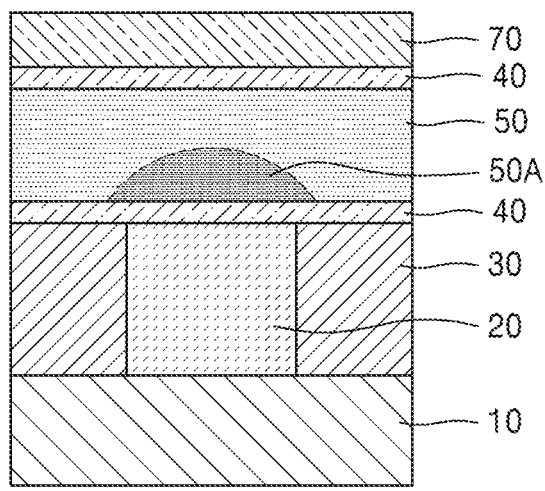

For example, as illustrated in FIG. 8, the diffusion prevention layer 40 may be disposed not between the first electrode 20 and the resistive-change material layer 50 but between the resistive-change material layer 50 and the second electrode 70. Also, as illustrated in FIG. 9, the diffusion prevention layer 40 may be disposed between the first electrode 20 and the resistive-change material layer 50 and between the resistive-change material layer 50 and the second electrode 70. In FIGS. 8 and 9, a case where a phase of a portion of the phase-change layer 50 is changed to form a phase-changed region 50A is illustrated as an example.

In the case of FIGS. 8 and 9, the diffusion prevention layer 40 may include a graphene diffusion prevention layer or a BN diffusion prevention layer.

In an example embodiment of FIG. 8, when the graphene diffusion prevention layer is provided as the diffusion prevention layer 40, the ALD layer 45 of FIG. 5 may be further provided so as to block the diffusion through the grain boundary of the diffusion prevention layer 40.

Also, in an example embodiment of FIG. 9, when the graphene diffusion prevention layer is provided as the diffusion prevention layer 40, the ALD layer 45 of FIG. 5 may be further provided so as to block the diffusion through the grain boundary of the diffusion prevention layer 40.

Figure 10:
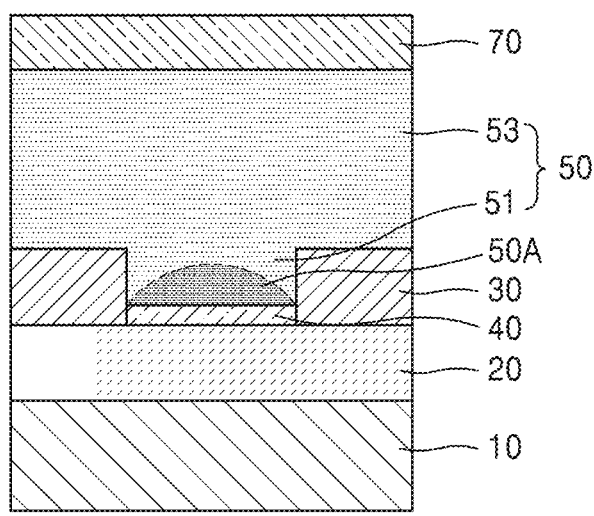
Figure 11:
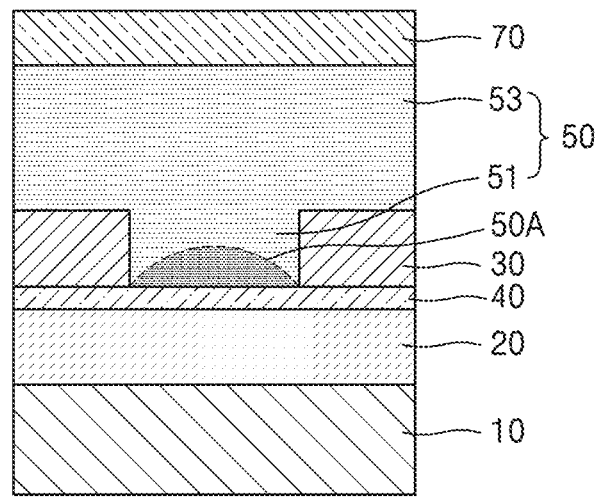

FIGS. 10 and 11 are cross-sectional views of a nonvolatile memory apparatus according to another example embodiment. The nonvolatile memory apparatus illustrated in FIGS. 10 and 11 differs from the nonvolatile memory apparatus illustrated in FIG. 1 in that a first electrode 20 is a pad electrode and a resistive-change material layer 50 has a limited cell structure. In FIGS. 10 and 11, a case where a phase of a portion of the phase-change layer 50 is changed to form a phase-changed region 50A is illustrated as an example.

Referring to FIGS. 10 and 11, the resistive-change material layer 50 may include a plug region 51 on a first electrode 20, and a relatively wide plane region 53 on the plug region 51. An interlayer insulating layer 30 may surround the plug region 51 of the resistive-change material layer 50.

As illustrated in FIG. 10, the diffusion prevention layer 40 may be disposed between the first electrode 20 and the plug region 51 to correspond to the plug region 51 of the resistive-change material layer 50.

As illustrated in FIG. 11, the diffusion prevention layer 40 may be formed on an entire region of the first electrode 20, and the plug region 51 of the resistive-change material layer 50 may be formed to contact a partial region of the diffusion prevention layer 40.

In FIGS. 10 and 11, the plug region 51 of the resistive-change material layer 50 may be narrower than the first electrode 20 and may be in contact with the diffusion prevention layer 40.

Also, in FIGS. 10 and 11, when the plug region 51 of the resistive-change material layer 50 is provided on a side closer to the first electrode 20, the phase-changed region 50A formed by changing a phase of a portion of the phase-change layer 50 is disposed in the plug region 51.

Meanwhile, in FIGS. 10 and 11, the first electrode 20 is formed as a pad type and the pad electrode 10 is disposed therebelow, but the pad electrode 10 may be omitted.

In the case of FIGS. 10 and 11, the diffusion prevention layer 40 may include a graphene diffusion prevention layer or a BN diffusion prevention layer. In the example embodiments of FIGS. 10 and 11, when the graphene diffusion prevention layer is provided as the diffusion prevention layer 40, the ALD layer 45 of FIG. 5 may be further provided so as to block the diffusion through the grain boundary of the diffusion prevention layer 40.

The nonvolatile memory apparatuses according to various example embodiments, which have been described with reference to FIGS. 1 to 11, are phase-change nonvolatile memory apparatuses including the phase-change layer 50 as the resistive-change material layer 50, and may be implemented by PRAMs.

Figure 12:
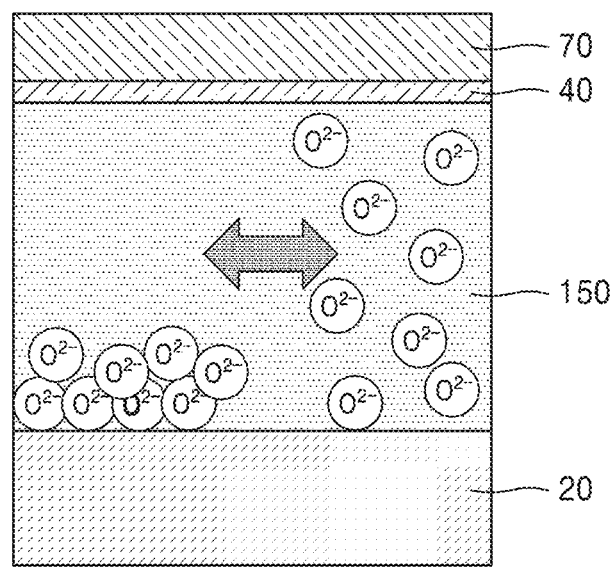

FIG. 12 is a cross-sectional view of a nonvolatile memory apparatus according to another example embodiment.

Referring to FIG. 12, the nonvolatile memory apparatus may include a resistive-change material layer 150 between a first electrode 20 and a second electrode 70, and a diffusion prevention layer 40 between the resistive-change material layer 150 and the second electrode 70.

In the nonvolatile memory apparatus according to an example embodiment, the resistive-change material layer 150 may be provided to store information due to a resistance difference through non-uniform diffusion of oxygen, that is, oxygen ion gradient, according to a control of a voltage applied through the first and second electrodes 20 and 70. To this end, the resistive-change material layer 150 may include, for example, $HfO_2$, $TaO_x$, $TiO_x$, Ag—Si, Ag—GeS2, or ZrTe—$AL_2O_3$.

The nonvolatile memory apparatus is a resistive-change nonvolatile memory apparatus that store information due to a resistance difference through non-uniform diffusion of oxygen in the resistive-change material layer 150, and may be implemented by an RRAM.

In the nonvolatile memory apparatus according to an example embodiment, the first and second electrodes 20 and 70 may include electrode materials applied to the resistive-change nonvolatile memory apparatus. For example, the first and second electrodes 20 and 70 may include one selected from among Al, Au, Cu, Ir, Ru, Pt, Ti, TiN, Ta, TaN, and Hf.

Also, the first electrode 20 may include at least one of various conductive materials such as TiN, TaN, TiAlN, TaSiN, WN, WNC, and doped-Si.

Figure 13:
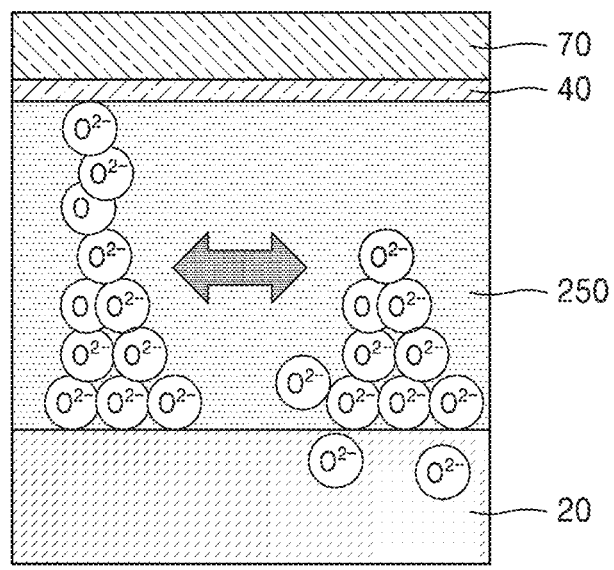
Figure 14:
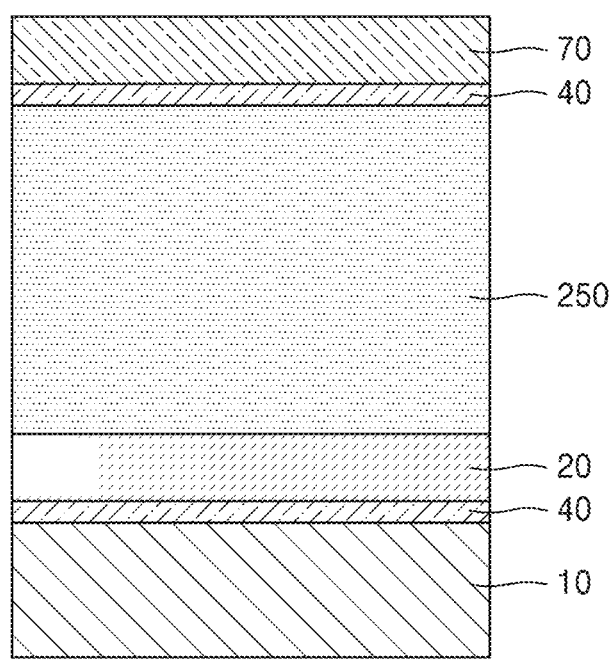

FIGS. 13 to 14 are cross-sectional views of a nonvolatile memory apparatus to another example embodiment.

Referring to FIGS. 13 and 14, the nonvolatile memory apparatus may include a resistive-change material layer 250 between a first electrode 20 and a second electrode 70, and a diffusion prevention layer 40 between the resistive-change material layer 250 and the second electrode 70. Also, as illustrated in FIG. 14, when a pad electrode 10 is further provided below the first electrode 20, the diffusion prevention layer 40 may be further provided between the first electrode 20 and the pad electrode 10.

In the nonvolatile memory apparatus according to an example embodiment, the resistive-change material layer 250 may be provided to store information due to a resistance difference through a filament formation of oxygen molecules according to a control of a voltage applied through the first and second electrodes 20 and 70. To this end, the resistive-change material layer 250 may include, for example, $HfO_2$, $TaO_x$, $TiO_x$, Ag—Si, Ag—GeS2, or ZrTe—$AL_2O_3$.

The nonvolatile memory apparatus is a resistive-change nonvolatile memory apparatus that store information due to the resistance difference through the filament formation, and may be implemented by an RRAM.

In this case, the first and second electrodes 20 and 70 may include electrode materials applied to the resistive-change nonvolatile memory apparatus. For example, the first and second electrodes 20 and 70 may include one selected from among Ti, TiN, Al, Au, Cu, Ir, Ru, Pt, Ti, TiN, Ta, TaN, and Hf. Also, the first electrode 20 may include at least one of various conductive materials such as TiN, TaN, TiAlN, TaSiN, WN, WNC, and doped-Si.

Also, as illustrated in FIG. 14, when the pad electrode 10 is further provided below the first electrode 20, the second electrode 70 and the pad electrode 10 may include one electrode material selected from among Al, Au, Cu, Ir, Ru, Pt, Ti, TiN, Ta, TaN, and Hf, and the first electrode 20 may include at least one of various conductive materials such as TiN, TaN, TiAlN, TaSiN, WN, WNC, and doped-Si.

As illustrated in FIGS. 12 to 14, in the case of the resistive-change nonvolatile memory apparatus that stores information due to the resistance difference through non-uniform diffusion of oxygen in the resistive-change material layer 150 or the resistance difference through the filament formation using oxygen molecules, the diffusion of oxygen into the second electrode 70 may be prevented by the diffusion prevention layer 40, thereby preventing the deterioration of reliability and the increase in the resistance of the memory cell.

Figure 15:
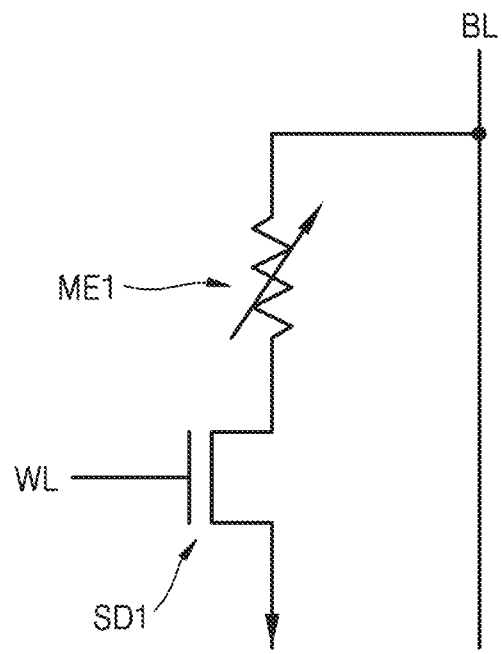
FIGS. 15 to 17 are cross-sectional views illustrating a circuit configuration of a nonvolatile memory cell, according to example embodiments.

FIG. 15 is a circuit diagram for describing a circuit configuration of a nonvolatile memory cell according to an example embodiment.

Referring to FIG. 15, a memory element ME1 may be provided, and a switching element SD1 may be electrically connected to the memory element ME1.

The memory element ME1 may include the nonvolatile memory apparatus described with reference to FIGS. 1 to 14. The memory element ME1 may be a unit cell including a resistive-change material layer 50, 150, or 250, first and second electrodes 20 and 70 connected thereto, and at least one diffusion prevention layer 40.

In an example embodiment, the switching element SD1 may be a transistor. For example, the switching element SD1 may be a metal-oxide-semiconductor field-effect transistor (MOSFET) or a bipolar junction transistor (BJT). The memory element ME1 may be connected to a bit line BL, and the switching element SD1 may be connected to a word line WL. The bit line BL and the word line WL may extend in an intersecting direction.

Such a nonvolatile memory cell may be provided as an array to implement a 1T1R memory array.

Figure 16:
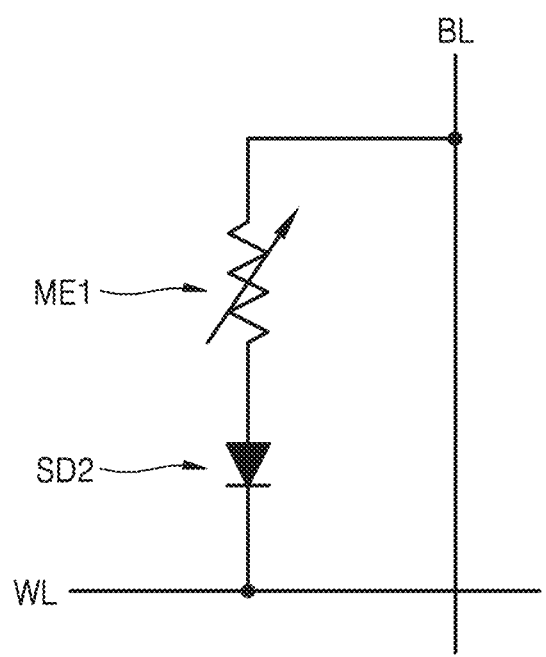

FIG. 16 is a circuit diagram for describing a circuit configuration of a nonvolatile memory cell according to another example embodiment.

Referring to FIG. 16, a memory element ME1 may be provided, and a switching element SD2 may be electrically connected to the memory element ME1. The switching element SD2 may be a diode. For example, the switching element SD2 may be a PN diode or a Schottky diode, or may be a silicon-based diode or an oxide-semiconductor-based diode. A type or a material of the diode may be variously modified. A word line WL and a bit line BL may intersect with each other, and the memory element ME1 and the switching element SD2 may be connected to an intersection point therebetween.

Such a nonvolatile memory cell may be provided as an array to implement a memory array having a cross-bar structure.

Figure 17:
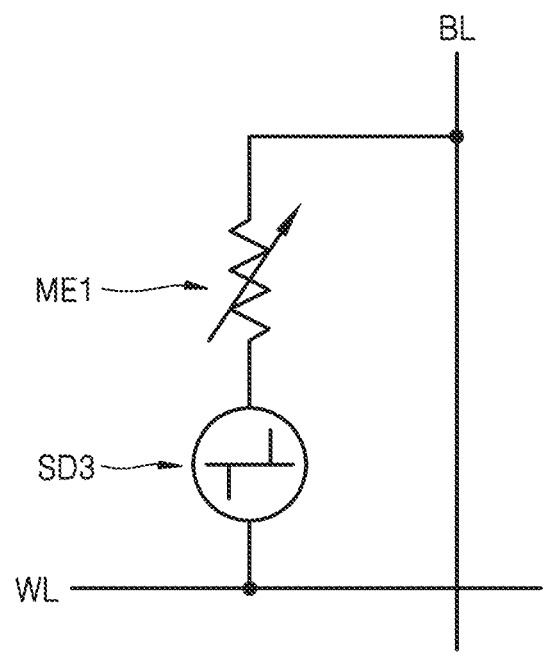

FIG. 17 is a circuit diagram for describing a circuit configuration of a phase-change memory cell according to another example embodiment.

Referring to FIG. 17, a memory element ME1 may be provided, and a switching element SD3 may be electrically connected to the memory element ME1. The switching element SD3 may be a threshold switch. For example, the switching element SD3 may be an ovonic threshold switch (OTS). The memory element ME1 and the switching element SD3 may be provided at an intersection point between the word line WL and the bit line BL. In some cases, a varistor may be applied as the switching element SD3.

Such a nonvolatile memory cell may be provided as an array to implement a memory array having a cross-bar structure.

Figure 18:
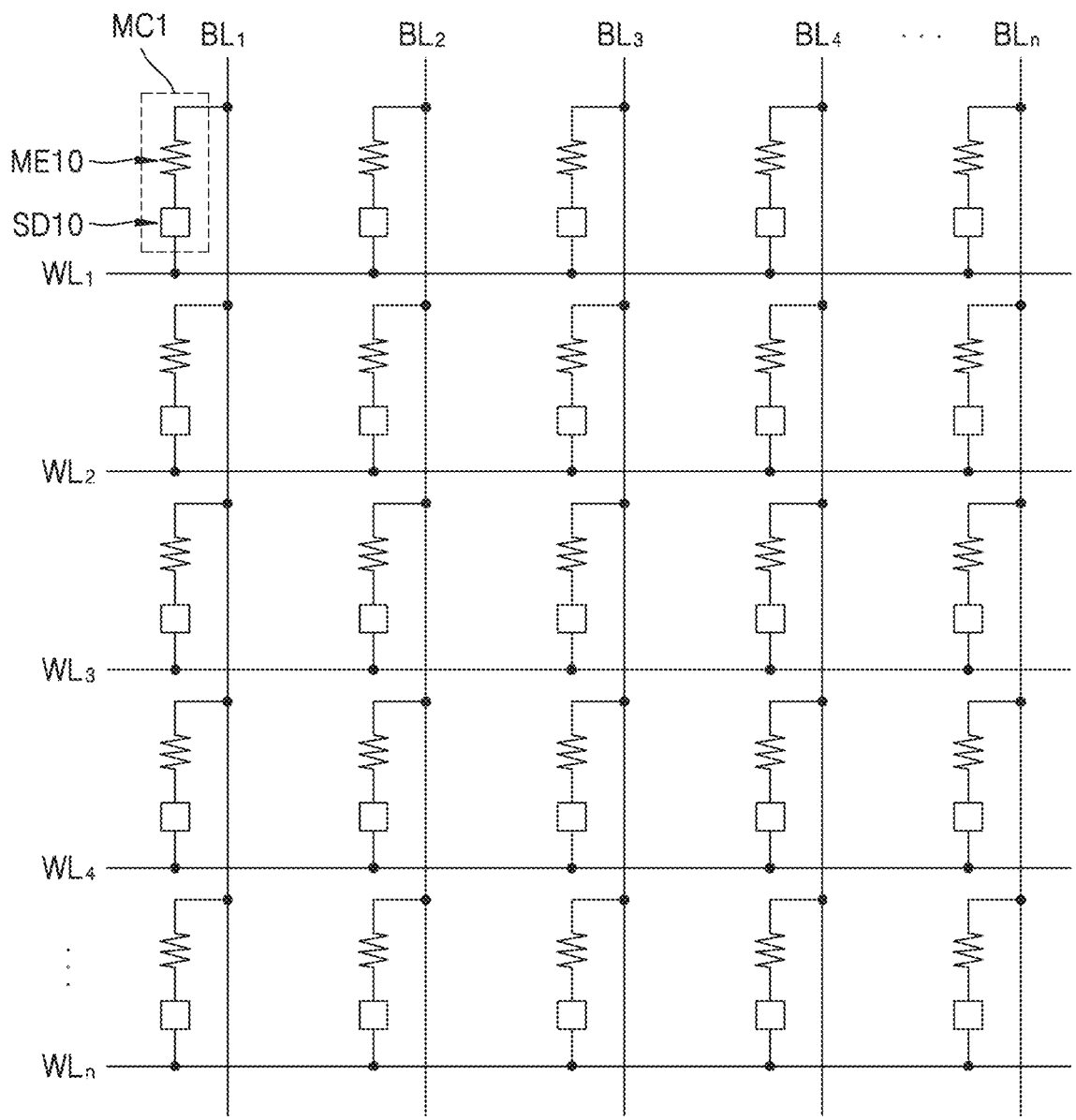
FIG. 18 is a cross-sectional view illustrating an array structure of a nonvolatile memory apparatus, according to example embodiments.

FIG. 18 is a circuit diagram for describing an array structure of a nonvolatile memory apparatus according to an example embodiment.

Referring to FIG. 18, a plurality of word lines WL1 to WLn may be arranged in parallel, and a plurality of bit lines BL1 to BLn may be arranged in a direction perpendicular to the plurality of word lines WL1 to WLn. The plurality of bit lines BL1 to BLn may intersect with the plurality of word lines WL1 to WLn. Memory cells MC1 may be provided at intersection points between the plurality of word lines WL1 to WLn and the plurality of bit lines BL1 to BLn. Each of the memory cells MC1 may include a memory element ME10 and a switching element SD10 connected thereto. The configuration of the memory cell MC1 may be identical or similar to those described with reference to FIGS. 15 to 17.

The nonvolatile memory apparatus of FIG. 18 may have a 2D array structure. However, the array structure of the nonvolatile memory apparatus according to an example embodiment is not limited to that illustrated in FIG. 18 and may be variously modified.

According to the nonvolatile memory apparatus, it is possible to reduce and/or prevent deterioration of resistance characteristics of the resistive-change material layer due to the diffusion prevention layer.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A nonvolatile memory apparatus comprising:
   a first electrode;
   a second electrode separated from the first electrode;
   a resistive-change material layer between the first electrode and the second electrode and configured to store information due to a resistance change caused by an electrical signal applied through the first electrode and the second electrode;
   a diffusion prevention layer between the first electrode and the resistive-change material layer, the diffusion prevention layer including a two-dimensional (2D) material; and
   a blocking layer between the diffusion prevention layer and the resistive change material layer.

2. The nonvolatile memory apparatus of claim 1, wherein the diffusion prevention layer is a graphene diffusion prevention layer comprising graphene.

3. The nonvolatile memory apparatus of claim 2, wherein the graphene diffusion prevention layer has a thickness of about 0.5 nm to about 20 nm.

4. The nonvolatile memory apparatus of claim 2, wherein the graphene diffusion prevention layer has a grain size of about 1 nm to about 20 nm.

5. The nonvolatile memory apparatus of claim 2, wherein the graphene diffusion prevention layer has a grain size of about 20 nm or more.

6. The nonvolatile memory apparatus of claim 1, wherein the two-dimensional (2D) material has a monolayer thickness of about 0.35 nm or less.

7. The nonvolatile memory apparatus of claim 1, wherein the blocking layer comprises one selected from among a metal, a nitride, and an oxide.

8. The nonvolatile memory apparatus of claim 7, wherein the blocking layer comprises one selected from among Ru, TiN, TaN, TiAlN, AlO, InO, ZnO, AlZnO, InZnO, and RuAlO.

9. The nonvolatile memory apparatus of claim 1, wherein the diffusion prevention layer is a boron nitride (BN) diffusion prevention layer comprising BN.

10. The nonvolatile memory apparatus of claim 1, wherein the first electrode is a plug electrode, and
the plug electrode is narrower than the resistive-change material layer and is in contact with a second diffusion prevention layer.

11. The nonvolatile memory apparatus of claim 1, wherein the resistive-change material layer comprises a plug region, and
the plug region is narrower than the first electrode and is in contact with a second diffusion prevention layer.

12. The nonvolatile memory apparatus of claim 1, wherein the resistive-change material layer is a phase-change layer configured to store information due to a resistance difference through a phase change.

13. The nonvolatile memory apparatus of claim 12, wherein the resistive-change material layer comprises one phase-change material selected from among GeTe, GeSb, GeSbTe, AgInSbTe, and N—GeSbTe.

14. The nonvolatile memory apparatus of claim 12, wherein a second diffusion prevention layer is between the first electrode and the resistive-change material layer, and the first electrode comprises at least one conductive material selected from among TiN, TaN, TiAlN, TaSiN, WN, WNC, and doped-Si.

15. The nonvolatile memory apparatus of claim 14, wherein the second electrode comprises at least one conductive material selected from among Al, Au, Cu, Ir, Ru, Pt, Ti, TiN, Ta, and TaN.

16. The nonvolatile memory apparatus of claim 14, further comprising a pad electrode in contact with the first electrode,
wherein the pad electrode comprises at least one conductive material selected from among Al, Au, Cu, Ir, Ru, Pt, Ti, TiN, Ta, and TaN.

17. The nonvolatile memory apparatus of claim 1, wherein the resistive-change material layer is configured to store information due to a resistance difference through non-uniform diffusion of oxygen or a resistance difference through a filament formation.

18. The nonvolatile memory apparatus of claim 17, wherein the resistive-change material layer comprises one selected from among HfO2, TaOx, TiOx, Ag—Si, Ag—GeS2, and ZrTe—Al2O3.

19. The nonvolatile memory apparatus of claim 17, further comprising:
a pad electrode in contact with the first electrode; and
a second diffusion prevention layer between the first electrode and the pad electrode.

* * * * *